(12) United States Patent
Cheng et al.

(10) Patent No.: US 8,222,100 B2
(45) Date of Patent: Jul. 17, 2012

(54) CMOS CIRCUIT WITH LOW-K SPACER AND STRESS LINER

(75) Inventors: Kangguo Cheng, Albany, NY (US); Bruce B. Doris, Yorktown Heights, NY (US)

(73) Assignee: International Business Machines Corporation, Armonk, NY (US)

(*) Notice: Subject to any disclaimer, the term of this patent is extended or adjusted under 35 U.S.C. 154(b) by 287 days.

(21) Appl. No.: 12/688,471

(22) Filed: Jan. 15, 2010

(65) Prior Publication Data

US 2011/0175169 A1 Jul. 21, 2011

(51) Int. Cl.
*H01L 21/8238* (2006.01)
*H01L 21/40* (2006.01)

(52) U.S. Cl. ......... 438/218; 257/369; 257/E21.64; 257/E27.062

(58) Field of Classification Search ............ 257/369, 257/E27.062, E21.64; 438/218
See application file for complete search history.

(56) References Cited

U.S. PATENT DOCUMENTS

| | | | |
|---|---|---|---|
| 6,107,667 A | 8/2000 | An et al. | |
| 6,238,982 B1 * | 5/2001 | Krivokapic et al. | 438/275 |
| 6,348,385 B1 | 2/2002 | Cha et al. | |
| 6,724,051 B1 | 4/2004 | Woo et al. | |
| 6,734,506 B2 * | 5/2004 | Oyamatsu | 257/369 |
| 7,253,123 B2 | 8/2007 | Arghavani et al. | |
| 7,354,838 B2 | 4/2008 | Kammler et al. | |
| 7,411,227 B2 * | 8/2008 | Amos et al. | 257/204 |
| 2003/0038305 A1 | 2/2003 | Wasshuber | |
| 2005/0266639 A1 | 12/2005 | Frohberg et al. | |
| 2006/0220152 A1 | 10/2006 | Huang et al. | |
| 2007/0042544 A1 | 2/2007 | Wu et al. | |
| 2007/0202640 A1 | 8/2007 | Al-Bayati et al. | |
| 2007/0202654 A1 | 8/2007 | Ajmera et al. | |
| 2007/0238309 A1 | 10/2007 | He et al. | |
| 2011/0156159 A1 * | 6/2011 | Ryoo et al. | 257/369 |

* cited by examiner

*Primary Examiner* — Lex Malsawma
(74) *Attorney, Agent, or Firm* — Scully, Scott, Murphy & Presser, P.C.; Louis J. Percello, Esq.

(57) ABSTRACT

The present disclosure provides a method of forming a plurality of semiconductor devices, wherein low-k dielectric spacers and a stress inducing liner are applied to the semiconductor devices depending upon the pitch that separates the semiconductor devices. In one embodiment, a first plurality of first semiconductor devices and a second plurality of semiconductor devices is provided, in which each of the first semiconductor devices are separated by a first pitch and each of the second semiconductor devices are separated by a second pitch. The first pitch separating the first semiconductor devices is less than the second pitch separating the second semiconductor devices. A low-k dielectric spacer is formed adjacent to gate structures of the first semiconductor devices. A stress inducing liner is formed on the second semiconductor devices.

19 Claims, 4 Drawing Sheets

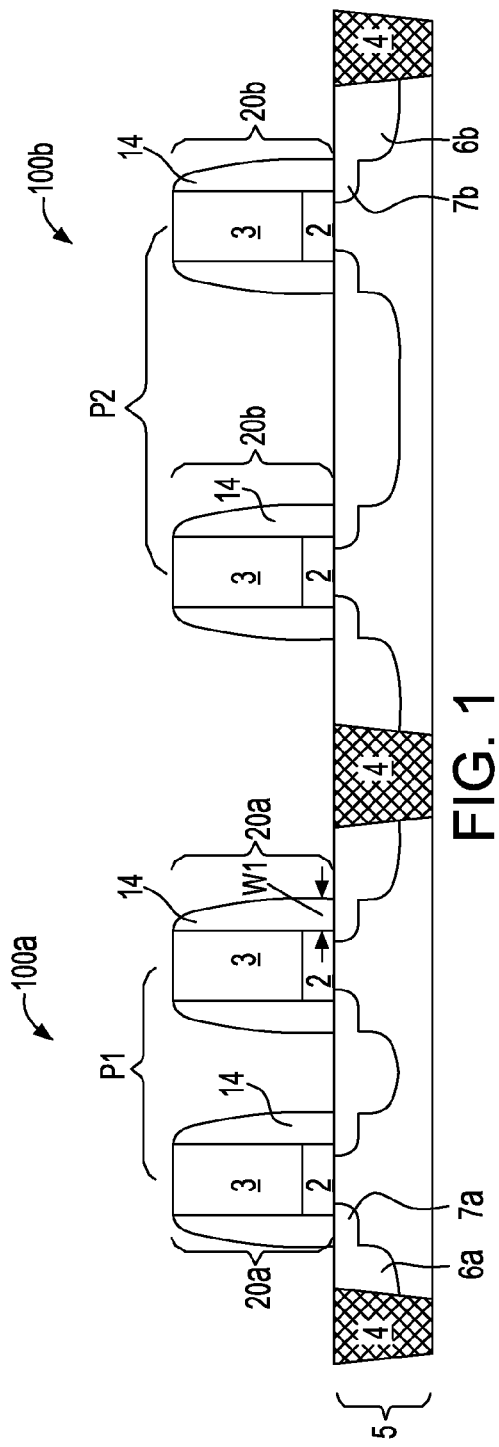
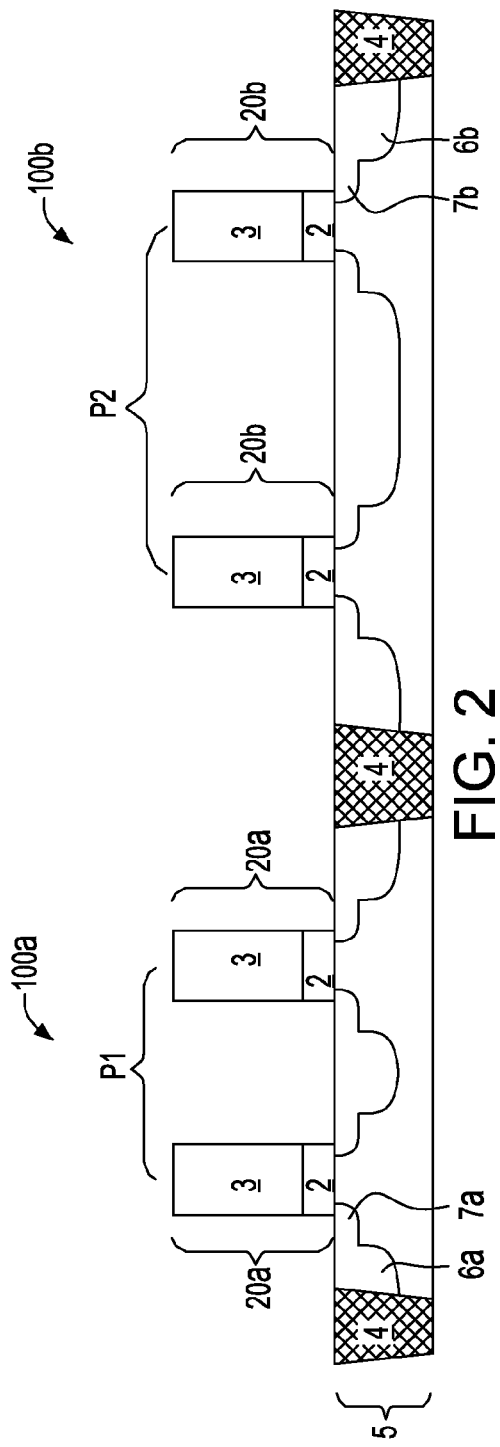

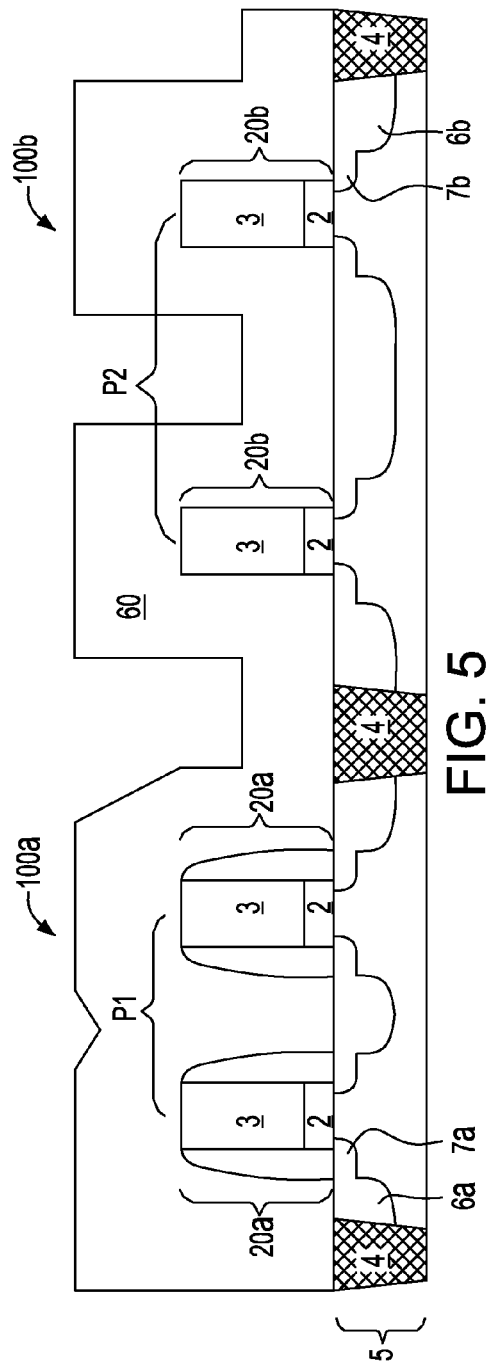
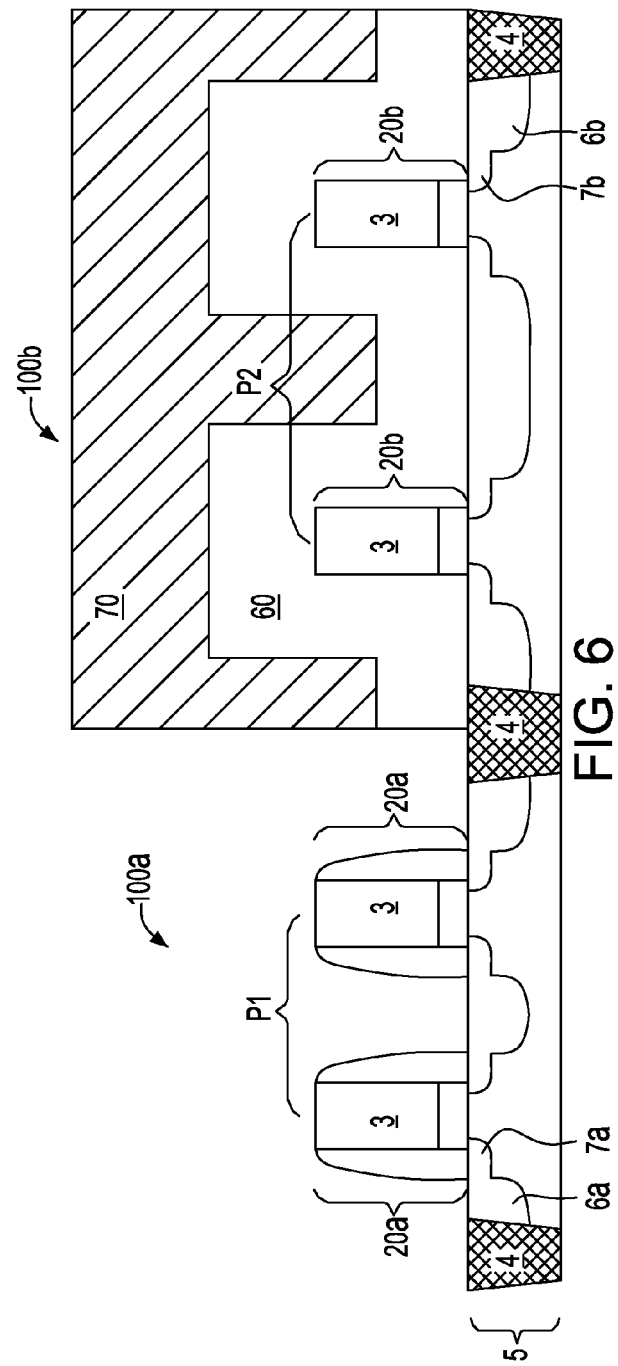

US 8,222,100 B2

CMOS CIRCUIT WITH LOW-K SPACER AND STRESS LINER

BACKGROUND

The present disclosure relates to semiconductor devices. More particularly, the present disclosure relates to scaling of semiconductor devices.

For more than three decades, the continued miniaturization of metal oxide semiconductor field effect transistors (MOSFETs) has driven the worldwide semiconductor industry. Various showstoppers to continued scaling have been predicated for decades, but a history of innovation has sustained Moore's Law in spite of many challenges. Since it has become increasingly difficult to improve MOSFETs and therefore complementary metal oxide semiconductor (CMOS) performance through continued scaling, methods for improving performance without scaling are being considered. One approach for doing this is to increase carrier (electron and/or hole) mobilities.

SUMMARY

In one embodiment, the present disclosure provides a method of forming a plurality of semiconductor devices, wherein low-k dielectric spacers and a stress inducing liner are applied to the semiconductor devices depending upon the pitch that separates the semiconductor devices. In one embodiment, a first plurality of first semiconductor devices and a second plurality of second semiconductor devices are provided, in which each of the first semiconductor devices are separated by a first pitch and each of the second semiconductor devices are separated by a second pitch. The first pitch separating the first semiconductor devices is less than the second pitch separating the second semiconductor devices. A low-k dielectric spacer is formed adjacent to gate structures of the first semiconductor devices. A stress inducing liner is formed on the second semiconductor devices.

In another aspect, an electronic device is provided that includes a first plurality of first semiconductor devices and a second plurality of second semiconductor devices. Each of the first semiconductor devices includes a first gate structure on a substrate having a first source and a first drain region adjacent to a portion of the substrate that the first gate structure is in contact with. The first gate structure of a first semiconductor device is separated from a first gate structure of an adjacent first semiconductor device by a first pitch. Each of the second semiconductor devices includes a second gate structure on a substrate having a second source region and a second drain region adjacent to a portion of the substrate that the second gate structure is in contact with. The second gate structure of second semiconductor device is separated from a second gate structure of an adjacent second semiconductor device by a second pitch. The first pitch is of a lesser dimension than the second pitch. Low-k dielectric spacers are present adjacent to the first gate structure of the first semiconductor devices, wherein the low-k dielectric spacers are not present adjacent to the second gate structure of the second semiconductor devices. A stress inducing liner is present on the second gate structure of the second semiconductor devices and overlying the substrate between the second gate structure of adjacent second semiconductor devices.

DESCRIPTION OF THE SEVERAL VIEWS OF THE DRAWINGS

The following detailed description, given by way of example and not intended to limit the invention solely thereto, will best be appreciated in conjunction with the accompanying drawings, wherein like reference numerals denote like elements and parts, in which:

FIG. 1 is a side cross-sectional view depicting a first plurality of first semiconductor devices separated by a first pitch and a second plurality of second semiconductor devices separated by a second pitch, wherein the dimension of the second pitch is greater than the dimension of the first pitch, in accordance with one embodiment of the present method.

FIG. 2 is a side cross-sectional view depicting removing the spacers from the gate structures of the first semiconductor device and the second semiconductor devices that are used to form the source and drain regions, in accordance with one embodiment of the present method.

FIG. 5 is side cross-sectional view depicting forming a stress inducing liner over the first semiconductor devices and the second semiconductor devices, in accordance with one embodiment of the present method.

FIG. 6 is a side cross-sectional view depicting forming a second etch mask on the stress inducing liner that is overlying the second semiconductor devices, wherein the portion of the stress inducing liner that is present over the first semiconductor devices is exposed, and removing the exposed portion of the stress inducing liner selective to the second etch mask and the first semiconductor devices, in accordance with one embodiment of the present method.

DETAILED DESCRIPTION

Figure 3:
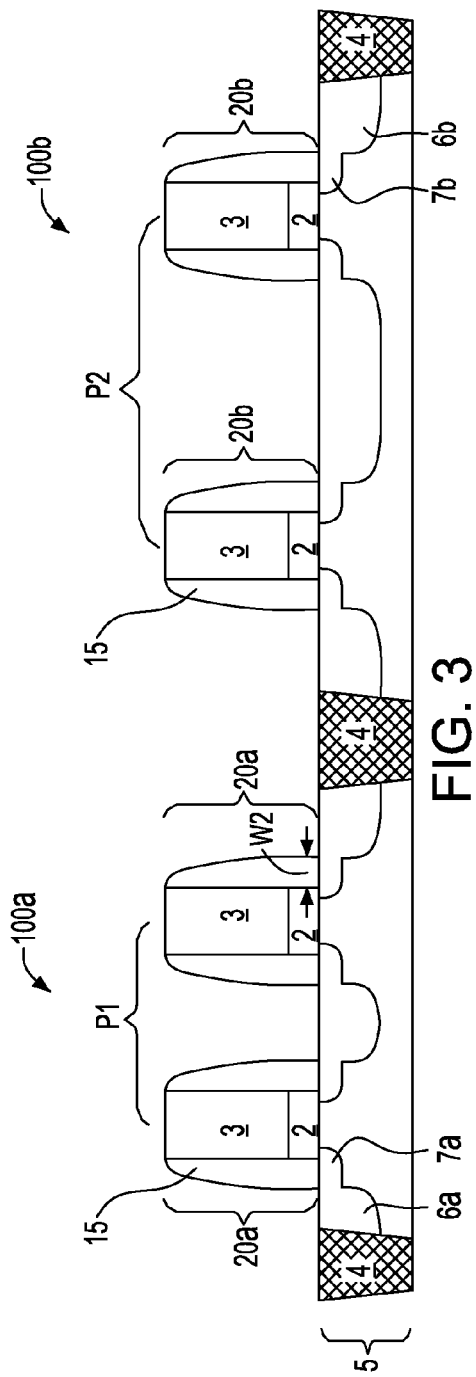
FIG. 3 is a side cross-sectional view depicting forming low-k dielectric spacers adjacent to the gate structures of the first and second semiconductor devices, in according with one embodiment of the present method.

Detailed embodiments of the present invention are disclosed herein; however, it is to be understood that the disclosed embodiments are merely illustrative of the invention that may be embodied in various forms. In addition, each of the examples given in connection with the various embodiments of the invention are intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the present invention.

Some embodiments of the present disclosure relate to methods and structures for producing semiconductor devices having stress induced performance enhancements in areas of the device having a relaxed pitch, and low-k dielectric spacers in areas of the device having a tight pitch. When describing the inventive method and structures, the following terms have the following meanings, unless otherwise indicated.

The term "stress inducing liner" and "stress inducing material" denotes a material having an intrinsic stress, in which the intrinsic stress effectuates a stress in an underlying material.

The term "compressive stress inducing material" denotes a material having an intrinsic compressive stress, in which the intrinsic compressive stress produces a compressive stress in an underlying material.

The term "tensile stress inducing material" denotes a material layer having an intrinsic tensile stress, in which the intrinsic tensile stress produces a tensile stress in an underlying material.

A "high-k" dielectric is a dielectric or insulating material having a dielectric constant that is equal to or greater than the dielectric constant of 4.0, as measured in a vacuum at room temperature.

A "low-k" dielectric is a dielectric or insulating material having a dielectric constant that is less 4.0, as measured in a vacuum at room temperature.

The term "direct contact" means that a first element, such as a first structure, and a second element, such as a second structure, are connected without any intermediary conducting, insulating or semiconductor layers at the interface of the two elements.

The term "pitch" means the center-to-center distance between two repeating elements of a circuit including semiconductor devices.

The terms "overlying", "atop", "positioned on" or "positioned atop" means that a first element, such as a first structure, is present on a second element, such as a second structure, wherein intervening elements, such as an interface structure, e.g. interface layer, may be present between the first element and the second element.

FIGS. 1-7 depict one embodiment of a method of forming a plurality of semiconductor devices 100a, 100b, wherein low-k dielectric spacers 55 and a stress inducing liner 60 are applied to the semiconductor devices 100a, 100b depending upon the pitch P1, P2 that separates the semiconductor devices 100a, 100b. The term "semiconductor devices" refers to an intrinsic semiconductor material that has been doped, that is, into which a doping agent has been introduced, giving it different electrical properties than the intrinsic semiconductor. Doping involves adding dopant atoms to an intrinsic semiconductor, which changes the electron and hole carrier concentrations of the intrinsic semiconductor at thermal equilibrium. The dominant carrier concentration in an extrinsic semiconductor determines the conductivity type of the semiconductor. As used herein, the term "conductivity type" denotes a dopant region being p-type or n-type. Although the devices depicted in FIGS. 1-7 are field effect transistors (FET), other semiconductor devices have been contemplated, and are within the scope of the present invention.

FIG. 1 depicts one embodiment of a first plurality of first semiconductor devices 100a, e.g., first conductivity type semiconductor devices, separated by a first pitch P1 and a second plurality of second semiconductor devices 100b, e.g. second conductivity type semiconductor devices, separated by a second pitch P2, wherein the dimension of the second pitch P2 is greater than the dimension of the first pitch P1.

Referring to FIG. 1, the gate structures 20a, 20b for the first and second semiconductor devices 100a, 100b may be formed atop a substrate 5 utilizing deposition, lithography and etch processes. The term "gate structure" means a structure used to control output current (i.e., flow of carriers in the channel) of a semiconducting device 100a, 100b through electrical or magnetic fields. In one embodiment, the gate structures 20a, 20b each include at least one gate conductor 3 positioned atop at least one gate dielectric 2. The substrate 5 includes, but is not limited to any semiconducting material including Si-containing materials, GaAs, InAs and other like semiconductors. Si-containing materials include, but are not limited to: Si, bulk Si, single crystal Si, polycrystalline Si, SiGe, amorphous Si, silicon-on-insulator substrates (SOI), SiGe-on-insulator (SGOI), annealed poly Si, and poly Si line structures. Layered semiconductors such as Si/Ge are also contemplated herein. Isolation regions 4 may be formed in the substrate 5. The isolation region 4 may comprise any dielectric material, such as oxide, nitride, oxynitride or a combination thereof.

In one example, the at least one gate dielectric 2 that is formed atop the substrate 5 is an oxide material, which may be greater than 0.8 nm thick. The at least one gate dielectric 2 may also be composed of a nitride, oxynitride, or combination thereof. In one embodiment, the at least one gate dielectric 2 ranges from 1.0 nm to 1.2 nm thick. The at least one gate dielectric 2 may be formed using deposition techniques, such as chemical vapor deposition (CVD), atomic layer CVD (AL-CVD), pulsed CVD, plasma assisted CVD, sputtering, and chemical solution deposition. In another embodiment, the at least one gate dielectric 2 is formed by a thermal growing process, which may include oxidation, oxynitridation, nitridation, and/or plasma or radical treatment. Suitable examples of oxides that can be employed for the at least one gate dielectric 2 include, but are not limited to: $SiO_2$, $Al_2O_3$, $ZrO_2$, $HfO_2$, $Ta_2O_3$, $TiO_2$, perovskite-type oxides and combinations and multi-layers thereof. The at least one gate dielectric 2 can be in either amorphous, polycrystalline, or epitaxial form. The at least one gate conductor 3 can be comprised of a semiconductor, such as polysilicon, a metal, a metal semiconductor alloy or combinations and multilayers thereof. The at least one gate conductor 3 is formed atop the at least one gate dielectric 2 utilizing a deposition process such as chemical vapor deposition (CVD), physical vapor deposition (PVD), e.g., sputtering or plating, or a combination thereof.

The gate structures 20a, 20b are formed from the deposited layers of the at least one gate dielectric 2 and the at least one gate conductor 3 utilizing any known patterning technique, for example, photolithography and etching. Specifically, in one embodiment a pattern is produced by applying a photoresist to the surface to be patterned, exposing the photoresist to a pattern of radiation, and then developing the pattern into the photoresist utilizing a conventional resist developer. Once the patterning of the photoresist is completed, the sections covered by the photoresist are protected, while the exposed regions are removed using a selective etching process that removes the unprotected regions.

In one embodiment, the gate structures 20a of the first semiconductor devices 100a have a first pitch P1, and the gate structures 20b of the second semiconductor devices 100b have a second pitch P2. In one embodiment, the first pitch P1 may be measured from the center of the upper surface of the gate conductor 3 of one first semiconductor device 100a to the center of the upper surface of the gate conductor 3 of an adjacent first semiconductor device 100a. In one embodiment, the second pitch P2 may be measured from the center of the upper surface of the at least one gate conductor 3 of a gate structure 20b of one second semiconductor device 100b to the center of the upper surface of the at least one gate conductor 3 of the gate structure 20b of an adjacent second semiconductor device 100b.

The first pitch P1 that is separating the adjacent gate structures 20a of the first semiconductor devices 100a is typically of a lesser dimension than the second pitch P2 that is separating the adjacent gate structures 20b of the second semiconductor devices 100b. The actual dimensions for the first pitch P1 and the second pitch P2 may depend upon the technology node. In one example, the first pitch P1 is less than 500 nm. In another example, the first pitch P1 ranges from 20 nm to 450 nm. In yet another example, the first pitch P1 ranges from 40 nm to 300 nm. In yet an even further example, the first pitch P1 ranges from 80 nm to 150 nm.

The second pitch P2 is typically greater than or equal to 1.5 times the dimension of the first pitch P1. In one example, the second pitch P2 is greater than 40 nm. In another example, the second pitch P2 is greater than 80 nm. In yet another example, the second pitch P2 ranges from 80 nm to 500 nm. In yet an even further example, the second pitch P2 is greater than 500 nm. The second pitch P2 in some examples can be greater than 1000 nm. Although not depicted in the supplied figures, the gate structures 20a, 20b may be formed using replacement gate techniques. Further, the materials and dimensions of the gate structures 20, 20b may be the same or different. In the embodiments, in which the gate structures 20a, 20b are different, selective processing of the gate structures 20a, 20b may be provided by block mask technology, e.g., photoresist masks formed using photolithography.

Following the formation of the gate structures 20a, 20b, a protection oxide layer may formed about and protecting the gate structures 20a, 20b. The protection oxide layer is produced by thermal oxidation of the gate structures 20a, 20b. A pre-doping of the at least one gate conductor 3 may be performed at this point of the present invention. A block-mask can be used prior to implantation to pre-select the substrate area for gate conductor doping with one dopant type.

The gate structures 20a, 20b are formed on the portion of the substrate 5 in which the channel of the semiconductor devices 100a, 100b is present. As used herein, the term "channel" is the region underlying the gate structure 20a, 20b and between the source and drain of the semiconductor device 100a, 100b that becomes conductive when the semiconductor device 100a, 100b is turned on. "Drain" means a doped region in the semiconductor device 100a, 100b located at the end of the channel, in which carriers are flowing out of the transistor through the drain. As used herein, the term "source" is a doped region in the semiconductor device 100a, 100b, in which majority carriers are flowing into the channel.

Still referring to FIG. 1, the source and drain regions are formed in the substrate 5 and typically include source extension regions 7a, drain extension regions 7b, deep source regions 6a, and the deep drain regions 6b. The source and drain regions may also include halo dopant regions. Source extension regions 7a and drain extension regions 7b are formed in the substrate 5 and partially extend under the gate structures 20a, 20b. The source extension regions 7a and the drain extension regions 7b are formed via ion implantation and comprise a combination of normally incident and angled implants to form the desired grading in the extensions. For producing n-type field effect transistor (NFET) devices group V elements from the periodic table of elements are implanted into a substrate 5 that is composed of a group IV element of the periodic table of elements. Implant energies for forming source extension regions 7a and drain extension regions 7b comprised of arsenic typically range from 1 keV to 5 keV. Implant energies for forming source extension regions 7a and drain extension regions 7b comprised of $BF_2$ typically range from 1 keV to 7 keV. Implant energies for forming source extension regions 7a and drain extension regions 7b comprised of boron range from 1 keV to 2 keV. These implants are typically carried out using a low concentration of dopant dose ranging from $4\times10^{14}$ atoms/cm$^2$ to $2\times10^{15}$ atoms/cm$^2$.

Following the formation of source extension regions 7a and drain extension regions 7b, first spacers 14 are formed abutting the gate structures 20a, 20b. First spacers 14 are formed using deposition and etch processes. In one embodiment, the first spacers 14 have a first spacer width W1 ranging from 3 nm to 40 nm. In another embodiment, the first spacers 14 have a first spacer width W1 ranging from 5.0 nm to 20.0 nm. In an even further embodiment, the first spacers 14 have a first spacer width W1 ranging from 7.0 nm to 15.0 nm. First spacers 14 may be comprised of a dielectric material, such as a nitride, e.g., silicon nitride.

A high energy ion implant is conducted to form deep source regions 6a and the deep drain regions 6b. These implants are typically carried out using a high concentration of dopant dose ranging from $1\times10^{15}$ atoms/cm$^2$ to $5\times10^{15}$ atoms/cm$^2$. In one embodiment, the dopant dose for the deep source region 6a and the deep drain region 6b is $3\times10^{15}$ atoms/cm$^2$. In some embodiments, the implant energy is dependent on implant species and the substrate 5. For example, an arsenic implant for deep source regions 6a and deep drain regions 6b into a silicon-containing substrate 5 typically requires an implant ranging from 10 keV to 20 keV. It is noted that any Group III or Group V element from the periodic table of elements is suitable for the deep source region 6a and the deep drain region 6b of the semiconductor device, in which the implant species is typically dependent upon whether the semiconductor device is an n-type semiconductor device or a p-type semiconductor device 100a, 100b. P-type refers to the addition of impurities to an intrinsic semiconductor that creates deficiencies of valence electrons. In a silicon-containing substrate, examples of n-type dopants, i.e., impurities, include but are not limited to boron, aluminum, gallium and indium. N-type refers to the addition of impurities that contributes free electrons to an intrinsic semiconductor. In a silicon-containing substrate examples of n-type dopants, i.e., impurities, include but are not limited to antimony, arsenic and phosphorous.

Following the formation of the deep source region 6a and the deep drain regions 6b, the dopants that are present in the deep source regions 6a, the deep drain regions 6b, the source extension regions 7a, the drain extension regions 7b, and the at least one gate conductor 3 are activated by activation annealing including at least one of rapid thermal annealing, furnace annealing, flash annealing, laser annealing, or any suitable combination of those annealing techniques. In one embodiment, the activation anneal is conducted at a temperature above 850° C. In another embodiment, the activation anneal is conducted at a temperature greater than 1000° C. This step of the present invention activates the dopant atoms, which changes the conductivity of the Si-containing material to which the dopants were implanted. Although not depicted in the Figures, raised source and raised drain regions have been contemplated and are within the scope of the present disclosure. Raised source and raised drain regions typically include a doped epitaxially grown semiconductor material that is adjacent to the gate structures 20a, 20b.

Silicide regions (not shown) may be formed atop the deep source region 6a, deep drain region 6b, and the at least one gate conductor 2. Silicide formation typically requires depositing a metal layer onto the surface of a Si-containing material or wafer. The metal layer may be deposited by at least one of chemical vapor deposition (CVD), plasma-assisted CVD, high-density chemical vapor deposition (HDCVD), plating, sputtering, evaporation and chemical solution deposition. Metals deposited for silicide formation include Ta, Ti, W, Pt, Co, Ni, and combinations thereof. Following deposition, the structure is then subjected to an annealing step, which may include rapid thermal annealing. During annealing, the deposited metal reacts with Si forming a metal silicide.

Referring to FIG. 2, in one embodiment, the first spacers 14 that are used to form the source and drain regions are removed from the gate structures 20a, 20b of the first semiconductor devices 100a and the second semiconductor devices 100b. In one embodiment, the first spacers 14 are removed by a selective etch process. As used herein, the term "selective" in reference to a material removal process denotes that the rate of material removal for a first material is greater than the rate of removal for at least another material of the structure to which the material removal process is being applied. In one embodiment, when the first spacers 14 are composed of silicon nitride, the etch chemistry for removing the silicon nitride first spacers 14 selective to the at least one gate structures 20a, 20b and the substrate 5 may be composed of at least one of hydrofluoric acid (HF), buffered HF, and phosphoric acid ($H_3PO_4$) solutions. The etch process may be an anisotropic etch process or an isotropic etch process. One example of an anisotropic etch process is reactive ion etching (RIE). Reactive Ion Etching (RIE) is a form of plasma etching in which during etching, the surface to be etched is placed on an RF powered electrode. Moreover, during RIE the surface to be etched takes on a potential that accelerates the etching species extracted from plasma toward the surface, in which the chemical etching reaction is taking place in the direction normal to the surface. Other examples of anisotropic etching that can be used at this point of the disclosure include ion beam etching, plasma etching or laser ablation. Isotropic etching may be achieved using a wet chemical etch. It is noted that other compositions have been contemplated for the first spacers 14, such as oxides, e.g., silicon oxide, and other selective etch chemistries are within the scope of the present disclosure for removing the first spacers 14 selective to at least the gate structures 20a, 20b.

FIG. 3 depicts forming low-k dielectric spacers 15 adjacent to the gate structures 20a, 20b of the first and second semiconductor devices 100a, 100b. In some embodiments, the low dielectric constant material of the low-k dielectric spacers 15 reduces parasitic capacitance between the gate structures 20a, 30b and at least one of the extension source region 7a and the extension drain region 7b. The low-k dielectric spacers 15 typically have a dielectric constant that is less than 4.0, e.g., 3.9. In one embodiment, the low-k dielectric spacers 15 have a dielectric constant ranging from 1.75 to 3.5. In another embodiment, the dielectric spacers 15 have a dielectric constant ranging from 2.0 to 3.2. In yet an even further embodiment, the dielectric spacers 15 have a dielectric constant ranging from 2.25 to 3.0. Examples of materials suitable for the low-k dielectric spacers 15 include organosilicate glass (OSG), fluorine doped silicon dioxide, carbon doped silicon dioxide, porous silicon dioxide, porous carbon doped silicon dioxide, spin-on organic polymeric dielectrics (e.g., SILK™), spin-on silicone based polymeric dielectric (e.g., hydrogen silsesquioxane (HSQ) and methylsilsesquioxane (MSQ), and combinations thereof.

The low-k dielectric spacers 15 are formed using deposition and etch processes. In one embodiment, low-k dielectric spacers 15 have a second spacer width W2 ranging from 3 nm to 40 nm. In another embodiment, the low-k dielectric spacers 15 have a second spacer width W2 ranging from 5.0 nm to 20.0 nm. In an even further embodiment, the low-k dielectric spacers 15 have a first spacer width W2 ranging from 7.0 nm to 15.0 nm.

Figure 4:
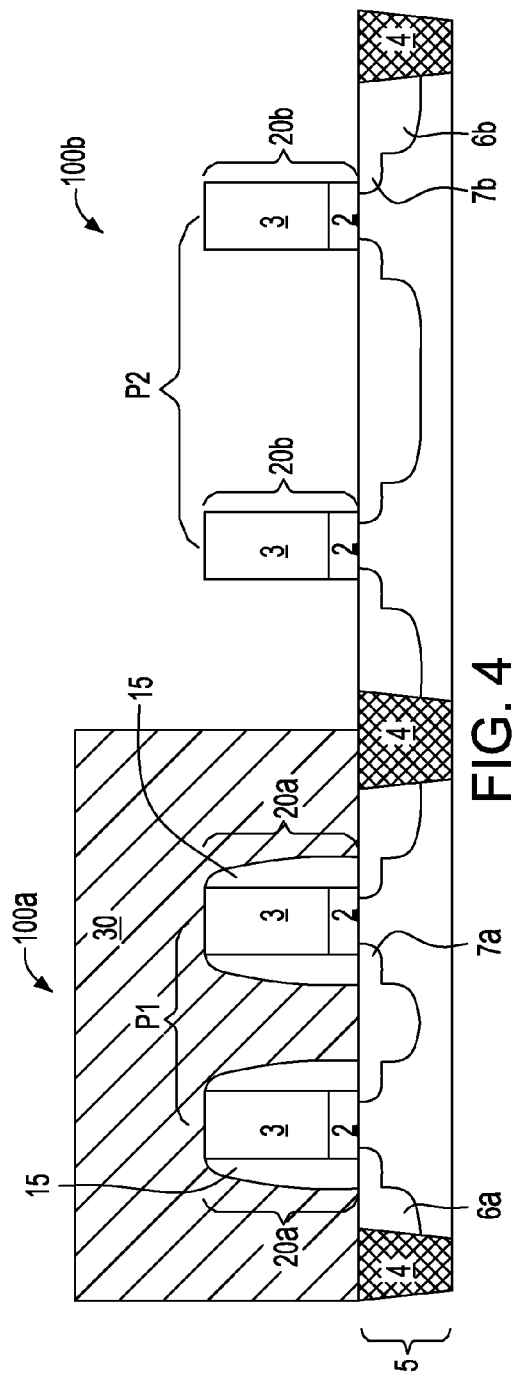
FIG. 4 is side cross-sectional view depicting forming a first etch mask overlying the first semiconductor devices and removing the low-k dielectric spacers from the gate structures of the second semiconductor devices, in accordance with one embodiment of the present method.

FIG. 4 depicts one embodiment of forming a first etch mask 30 overlying the first semiconductor devices 100a that are separated by the first pitch P1, and removing the low-k dielectric spacers 15 from the gate structures 20b of the second semiconductor devices 100b that are separated by second pitch P2, wherein the second pitch P2 is of a greater dimension than the first pitch P1.

In one embodiment, the first etch mask 30 is formed protecting the portion of the substrate 5, in which the first semiconductor devices 100a that are separated by the first pitch P1 are present. The exposed portion of the substrate 5 that is not protected by the first etch mask 30 contains the second semiconductor devices 100b that are separated by the second pitch P2.

The first etch mask 30 may comprise soft and/or hardmask materials and can be formed using deposition, photolithography and etching. In one embodiment, the first etch mask 30 comprises a photoresist. A photoresist first etch mask 30 can be produced by applying a photoresist layer to the surface of the substrate 5, exposing the photoresist layer to a pattern of radiation, and then developing the pattern into the photoresist layer utilizing a resist developer.

In another embodiment, the first etch mask 30 can be a hardmask material. Hardmask materials include dielectric systems that may be deposited by chemical vapor deposition (CVD) and related methods. Typically, the hardmask composition includes silicon oxides, silicon carbides, silicon nitrides, silicon carbonitrides, etc. Spin-on dielectrics may also be utilized as a hardmask material including, but not limited to: silsequioxanes, siloxanes, and boron phosphate silicate glass (BPSG). A first etch mask 30 comprising a hardmask material may be formed by blanket depositing a layer of hardmask material, providing a patterned photoresist atop the layer of hardmask material, and then etching the layer of hardmask material to provide a first etch mask 30.

The low-k dielectric spacers 15 are typically removed from the gate structures 20b of the second semiconductor devices 100b using a selective etch method, while the low-k dielectric spacers 15 that are present adjacent to the gate structures 20a of the first semiconductor devices 100a are protected by the first etch mask 30. In one embodiment, low-k dielectric spacers 15 are removed by a selective etch process. For example, the etch chemistry for removing the low-k dielectric spacers 15 is selected so that the low-k dielectric spacers 15 may be removed without substantially etching the second gate structures 20b of the second semiconductor devices 100b, the substrate 5 and the first etch mask 30. In one embodiment, when the low-k dielectric spacers 15 are composed of carbon doped silicon dioxide, the etch chemistry for removing the low-k dielectric spacers 15 selective to the gate structures 20b, the silicon-containing substrate 5 and the photoresist first etch mask 30 may be composed of at least one of carbon fluoride. The etch process may be an anisotropic etch process or an isotropic etch process. Examples of an anisotropic etch processes that are suitable for removing the low-k dielectric spacers 15 include reactive ion etch (RIE), plasma etching or laser ablation. One example of an isotropic etch method that is suitable for removing the low-k dielectric spacers is wet chemical etching.

It is noted that the low-k dielectric spacers 15 remain abutting the gate structures 20a of the first semiconductor devices 100a having a first pitch P1, while the low-k dielectric spacers 15 have been removed from the gate structures 20b of the second semiconductor devices 100b having the greater second pitch P2.

Although FIGS. 3 and 4 depict where the low-k dielectric spacers 15 are formed adjacent to each of the gates structures 20a, 20b followed by the formation of the first etch mask 30 to remove the low-k dielectric spacers 15 from the second semiconductor devices 100b, embodiments have been contemplated where the first etch mask 30 is formed over the second semiconductor devices 100b before the low-k dielectric spacers 15 have been formed. In this embodiment, the low-k dielectric spacers 15 are only formed adjacent to the gate structures 20a of the first semiconductor devices 100a, in which the first etch mask 30 functions as a block mask in obstructing the low-k dielectric spacers 15 from being formed adjacent to the gate structures 20b of the second semiconductor devices 100b.

Referring to FIG. 5, the first etch mask 30 is removed to expose the first semiconductor devices 100a, and a stress inducing liner 60 is formed over the first semiconductor devices 100a and the second semiconductor devices 100b. In one embodiment, in which the first etch mask 30 is composed of photoresist, the first etch mask 30 may be removed using a chemical strip or oxygen ashing. In one embodiment, in which the first etch mask 30 is composed of a dielectric material, the first etch mask 30 may be removed using a selective etch.

The strain inducing liner 60 may be composed of a compressive stress inducing material or a tensile stress inducing material that is blanket deposited over the gate structures 20a, 20b of the first semiconductor devices 100a and the second semiconductor devices 100b. In one embodiment, the strain inducing liner 60 is deposited directly on the gate structures 20a and the low-k dielectric spacers 15 of the first semiconductor devices 100a, and is deposited directly on the gate structures 20b of the second semiconductor devices 100b. In one embodiment, the portion of the strain inducing liner 60 that is present on the gate structures 20a of the first semiconductor devices 100a is in direct contact with the low-k dielectric spacers 15, in which the low-k dielectric spacers 15 are in direct contact with the sidewalls of the gate conductor 3 and the gate dielectric 2 of the gate structures 20a of the first semiconductor devices 100a. In one embodiment, the portion of the strain inducing liner 60 that is present on the gate structures 20b of the second semiconductor devices 100b is in direct contact with the sidewalls of the gate conductor 3 and the gate dielectric 2 of the gate structures 20b of the second semiconductor devices 100b.

In one embodiment, the strain inducing liner 60 is a comprised of a nitride, e.g., silicon nitride. Other examples of materials for the strain inducing liner 60 include silicon carbide, carbon film, silicon oxynitride, boron nitride, and combinations thereof. The strain inducing liner 60 is typically blanket deposited atop the substrate 5, the first semiconductor devices 100a, and the second semiconductor devices 100b. The strain inducing liner 60 is typically a conformal layer. The term "conformal" denotes a layer having a thickness that does not deviate from greater than or less than 30% of an average value for the thickness of the layer. In one embodiment, the strain inducing liner 60 has a thickness ranging from 20 nm to 150 nm. In another embodiment, the strain inducing liner 60 has a thickness ranging from 50 nm to 100 nm. In yet a further embodiment, the strain inducing liner 60 has a thickness ranging from 60 nm to 80 nm.

Plasma enhanced chemical vapor deposition (PECVD) is one example of a deposition method that can provide strain inducing liners 60 composed of nitride, e.g., silicon nitride, and having a compressive or tensile internal stress. The stress state of nitride-containing strain inducing liners 60 deposited by PECVD can be controlled by changing the deposition conditions to alter the reaction rate within the deposition chamber. More specifically, the stress state of a strain inducing liner 60 comprised of silicon nitride may be set by changing the deposition conditions such as: $SiH_4/N_2$/He gas flow rate, pressure, RF power, and electrode gap. Although wishing not to be limited, it is believed that the incorporation of H into the nitride-containing strain inducing liners 60 increases the compressive nature of the layer. Rapid thermal chemical vapor deposition (RTCVD) can provide nitride-containing strain inducing liners 60 having an internal tensile stress. The magnitude of the internal tensile stress produced within nitride-containing strain inducing liners 60 deposited by RTCVD can be controlled by changing the deposition conditions. More specifically, the magnitude of the tensile stress within strain inducing liners 60 comprised of silicon nitride may be set by changing deposition conditions such as: precursor composition, precursor flow rate and temperature.

FIG. 6 depicts one embodiment of forming a second etch mask 70 on the stress inducing liner 60 that is overlying the second semiconductor devices 100b, wherein the portion of the stress inducing liner 60 that is present over the first semiconductor devices 100a is exposed and removed using an etch process. The exposed portion of the stress inducing liner 60 may be removed selectively to the second etch mask 70 and the first semiconductor devices 100b. The second etch mask 70 may be composed of photoresist or may be composed of a hard mask material. It the embodiments, in which the second etch mask 70 is composed of a hard mask material, any material may be employed for the hard mask material so long as the hard mask material provides that the stress inducing liner 60 may be etched selectively to the hard mask material. In one embodiment, in which the stress inducing liner 60 is composed of silicon nitride, the hard mask material may be an oxide, such as silicon oxide. It is noted that the second etch mask 70 is similar to the first etch mask 60. Therefore, the description of methods for forming the first etch mask 60 is applicable for forming the second etch mask 70.

In one embodiment, the exposed portion of the stress inducing liner 60 is removed by a selective etch process that removes the material of the stress inducing liner 60 selective to the second etch mask 70, and the semiconductor devices 100a that are separated by the first pitch P1 which are underlying the exposed portion of the stress inducing liner 60. In one embodiment, when the stress inducing liner 60 is composed of silicon nitride and the second etch mask 70 is composed of a photoresist material, the etch chemistry for removing the exposed portion of the stress inducing liner 60 selective to the underlying semiconductor devices 100a and the second etch mask 70 may be composed of at least one of hydrofluoric acid (HF), buffered HF, and phosphoric acid ($H_3PO_4$) solutions. The etch process may be an anisotropic etch process or an isotropic etch process. One example of an anisotropic etch process suitable for removing the exposed portion of the stress inducing liner 60 is reactive ion etch (RIE). Other examples of anisotropic etching that can be used at this point of the disclosure include ion beam etching, plasma etching or laser ablation. Isotropic etching may be achieved using a wet chemical etch. It is noted that other compositions have been contemplated for the stress inducing liner 60, such as silicon carbide, carbon film, and other selective etch chemistries are within the scope of the present disclosure for removing the exposed portion of the stress inducing liner 60.

Figure 7:
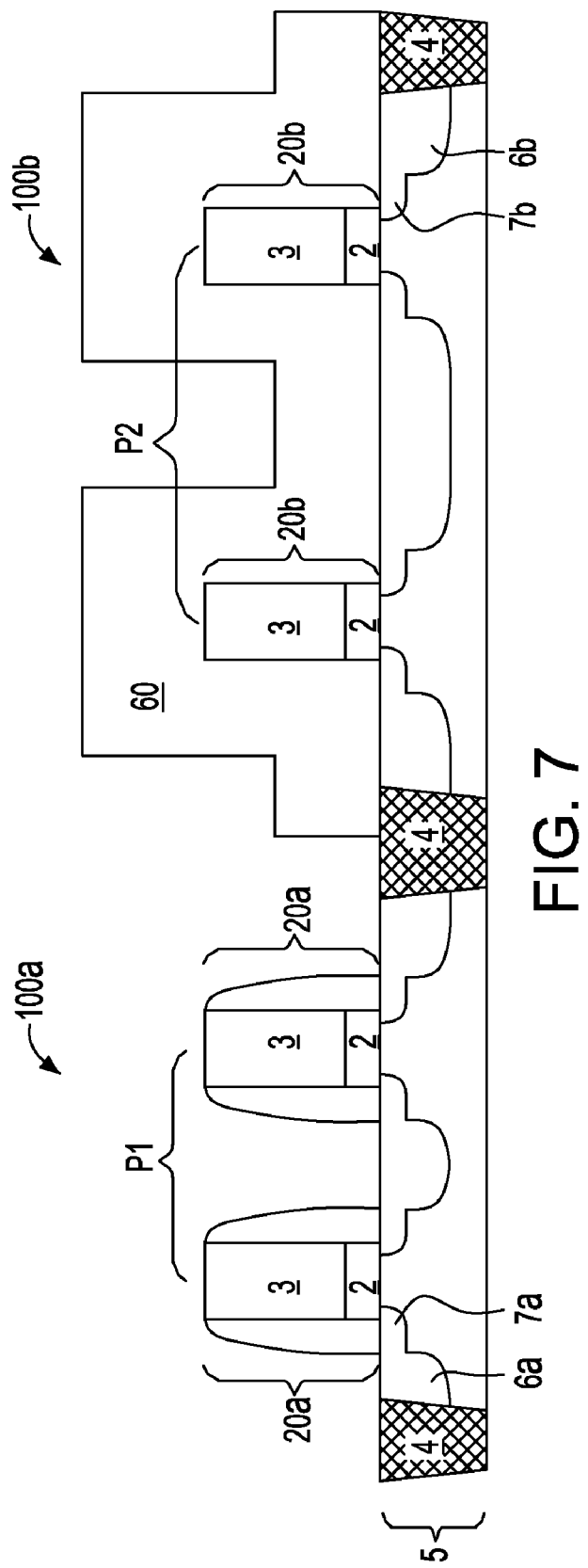
FIG. 7 is a side cross-sectional view depicting removing the second etch mask, in which an electrical device is provided having low-k dielectric spacers adjacent to the gate structures of the first semiconductor devices and a stress inducing liner overlying the second semiconductor devices, in accordance with one embodiment of the present method and structure.

In one embodiment, in which the second etch mask 70 is composed of photoresist, the second etch mask 70 may be removed using a chemical strip or oxygen ashing to provide the structure depicted in FIG. 7. In one embodiment, in which the second etch mask 70 is composed of a dielectric material, the second etch mask 70 may be removed using a selective etch.

FIG. 7 depicts one embodiment of an electronic device in accordance with the present disclosure. The electronic device includes a first plurality of first semiconductor devices 100a, i.e., first conductivity semiconductor devices, wherein each of the first semiconductor devices 100a includes a first gate structure 20a on a substrate 5, wherein the first gate structure 20a of adjacent first semiconductor devices 100a are separated by a first pitch P1. Low-k dielectric spacers 15 are present adjacent to the first gate structure 20a of the first semiconductor devices 100a. The low-k dielectric spacers 15 are present in the tight pitch, i.e., first pitch P1, area of the device. In some embodiments, the low-k dielectric spacers 15 reduce the parasitic capacitance between the gate structures 20a and the extension source region 7a/extension drain region 7b of the first semiconductor devices 100a, in which the stress inducing liner 60 is not present. In one embodiment, the first semiconductor devices 100a, i.e., first conductivity semiconductor devices, are p-type semiconductor devices, e.g., p-type field effect transistors (pFET).

The electronic device further includes a second plurality of second semiconductor devices 100b, i.e., second conductivity semiconductor devices, wherein each of the second semiconductor devices 100b includes a second gate structure 20b, wherein the second gate structure 20b of adjacent second semiconductor devices 100b are separated by a second pitch P2 that is of a greater dimension than the first pitch P1. The length of the second pitch P2 is of a dimension that allows for a stress inducing liner 60 to be present on the second gate structure 20b of the second semiconductor devices 100b and directly contacting the substrate 5 between the second gate structures 20b of adjacent second semiconductor devices 100b. The low-k dielectric spacers 15 that are present abutting the first gate structures 20a of the first semiconductor devices 100a are not present adjacent to the second gate structure 20b of the second semiconductor devices 100b.

In one embodiment, when the second semiconductor devices 100b are composed of p-type semiconductor devices, e.g., p-type field effect transistors (pFET), the stress inducing liner 60 induces a compressive stress on the channel region of the underlying second semiconductor devices 100b. In another embodiment, when the second semiconductor devices 100b are composed of n-type semiconductor devices, e.g., n-type field effect transistors (nFET), the stress inducing liner 60 induces a tensile stress on the channel region of the underlying second semiconductor devices 100b. In some embodiments, the stress on the channel of the second semiconductor device 100b induced by the stress inducing liner 60 has a magnitude ranging from 100 MPa to about 1000 MPa. In one example, the stress on the channel of the second semiconductor device 100b has a magnitude ranging from 300 MPa to about 400 MPa.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A method of forming an electrical device comprising:
providing a first plurality of first semiconductor devices and a second plurality of second semiconductor devices, wherein each of the first semiconductor devices is separated by a first pitch and each of the second semiconductor devices is separated by a second pitch, wherein the first pitch is of a lesser dimension than the second pitch;
forming a low-k dielectric spacer adjacent to first gate structures of the first semiconductor devices; and
forming a stress inducing liner on the second semiconductor devices, wherein the stress inducing liner is not present overlying the first semiconductor devices.

2. The method of claim 1 wherein forming the first gate structures comprises:
depositing at least one first gate dielectric atop a substrate;
depositing at least one first gate conductor atop said at least one first gate dielectric;
forming an etch mask atop the at least one first gate conductor; and
etching the at least one gate conductor and the at least one gate dielectric selective to the etch mask to form the first gate structures.

3. The method of claim 1 wherein the second semiconductor devices further comprise a second gate structure including a second gate conductor atop a second gate dielectric.

4. The method of claim 3, wherein prior to forming the low-k dielectric nth spacer adjacent to the first gate structures of the first semiconductor devices, source regions and drain regions are formed in a substrate on which the first semiconductor devices and the second semiconductor devices are positioned on, wherein forming the source regions and drain regions comprises:
forming at least one first spacer on sidewalls of at least one of the first gate structures and the second gate structure;
doping the substrate with n-type or p-type dopants; and
removing the at least one first spacer from the at least one of the first gate structure of the first semiconductor device.

5. The method of claim 4, wherein the forming the low-k dielectric spacer adjacent to the first gate structures comprises blanket depositing a low-k dielectric material overlying at least the first gate structures, and etching the low-k dielectric material so that a remaining portion of the low-k dielectric material is present on sidewalls of the first gate structures.

6. The method of claim 4, wherein the forming the low-k dielectric spacer adjacent to the first gate structures further comprises forming the low-k dielectric spacer adjacent to the second gate structure.

7. The method of claim 6, wherein prior to the forming of the stress inducing liner on the second semiconductor devices, the low-k dielectric spacer is removed from the second gate structure, wherein removing the low-k dielectric spacer from the second gate structure comprises forming a first etch mask overlying the first semiconductor devices and etching the low-k dielectric spacer selective to the first etch mask and the second semiconductor devices.

8. The method of claim 1, wherein the stress inducing liner produces a compressive stress or tensile stress on the second semiconductor devices and the forming of the stress inducing liner comprises deposition by chemical vapor deposition.

9. The method of claim 1, wherein the forming of the stress inducing liner on the second semiconductor devices, wherein the stress inducing liner is not present overlying the first semiconductor devices comprises:
blanket depositing a stress inducing material overlying the first semiconductor devices and the second semiconductor devices;
forming a second etch mask overlying the stress inducing material that is present over the second semiconductor devices, wherein the second etch mask is not present overlying an exposed portion of the stress inducing material that is present over the first semiconductor devices; and
etching the exposed portion of the stress inducing material selective to the second etch mask and the first semiconductor devices.

10. The method of claim 1, wherein the first pitch ranges from 50 nm to 500 nm, and the second pitch is greater than 1.5 times the first pitch.

11. An electronic device comprising:
a first plurality of semiconductor devices, wherein each of the first plurality of semiconductor devices includes a first gate structure on a substrate, wherein the first gate structure of adjacent first conductivity semiconductor devices are separated by a first pitch;
a second plurality of second semiconductor devices, wherein each of the second semiconductor devices includes a second gate structure, wherein the second gate structure of adjacent second plurality of semiconductor devices are separated by a second pitch that is of a greater dimension than the first pitch;
low-k dielectric spacers adjacent to the first gate structure of the first plurality of semiconductor devices, wherein the low-k dielectric spacers are not present on the second gate structure of the second plurality of semiconductor devices; and
a stress inducing liner present on the second gate structure of the second plurality of semiconductor devices and directly contacting the substrate between the second gate structure of adjacent second plurality of semiconductor devices.

12. The electronic device of claim 11, wherein the stress inducing liner induces a compressive or tensile stress on the second plurality of semiconductor device.

13. The electronic device of claim 11, wherein the stress inducing liner comprises silicon nitride.

14. The electronic device of claim 11, wherein the stress inducing liner has a thickness ranging from about 20 nm to about 100 nm.

15. The electronic device of claim 11, wherein the low-k dielectric spacers have a dielectric constant ranging from 1.75 to 3.5.

16. The electronic device of claim 11, wherein the low-k dielectric spacers are comprised of organosilicate glass (OSG), fluorine doped silicon dioxide, carbon doped silicon dioxide, porous silicon dioxide, porous carbon doped silicon dioxide, spin-on organic polymeric dielectrics, hydrogen silsesquioxane (HSQ), methylsilsesquioxane (MSQ) or combinations thereof.

17. The electronic device of claim 11, wherein the low-k dielectric spacers have a width ranging from 10 nm to about 60 mm.

18. The electronic device of claim 11, wherein a stress on a channel of the second gate structure induced by the stress inducing liner is a compressive or tensile stress having a magnitude ranging from about 100 MPa to about 1000 MPa.

19. The electronic device of claim 11, wherein the first pitch ranges from 50 nm to 500 nm, and the second pitch is greater than 1.5 times the first pitch.

* * * * *